United States Patent
Bae et al.

(10) Patent No.: US 7,244,542 B2
(45) Date of Patent: Jul. 17, 2007

(54) RESINS AND PHOTORESIST COMPOSITIONS COMPRISING SAME

(75) Inventors: Young C. Bae, Worcester, MA (US); George G. Barclay, Jefferson, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/448,961

(22) Filed: May 30, 2003

(65) Prior Publication Data
US 2004/0038150 A1  Feb. 26, 2004

(51) Int. Cl.
*G03F 7/004* (2006.01)
*G03C 5/00* (2006.01)

(52) U.S. Cl. ............... 430/270.1; 430/326; 430/905

(58) Field of Classification Search .......... 430/270.1, 430/306, 322, 913, 905, 320, 325, 330; 526/305, 526/308, 309, 313
See application file for complete search history.

(56) References Cited

U.S. PATENT DOCUMENTS

| | | | |
|---|---|---|---|
| 5,674,657 A * | 10/1997 | Tan et al. ............... 430/191 |
| 5,837,419 A * | 11/1998 | Ushirogouchi et al. .. 430/270.1 |
| 6,090,526 A * | 7/2000 | Kumar .................... 430/285.1 |
| 6,228,552 B1 | 5/2001 | Okino et al. |
| 6,235,446 B1 | 5/2001 | Ikemura et al. |
| 6,280,897 B1 * | 8/2001 | Asakawa et al. ........ 430/270.1 |
| 6,303,266 B1 * | 10/2001 | Okino et al. ............. 430/270.1 |
| 6,338,931 B1 * | 1/2002 | Maeda et al. ............... 430/170 |
| 6,406,828 B1 | 6/2002 | Szmanda et al. |
| 6,528,233 B2 * | 3/2003 | Adegawa ................. 430/270.1 |
| 6,680,159 B2 | 1/2004 | Barclay et al. |
| 6,692,888 B1 | 2/2004 | Barclay et al. |
| 6,806,026 B2 * | 10/2004 | Allen et al. ............... 430/270.1 |

FOREIGN PATENT DOCUMENTS

JP  2002-107933 A  4/2002
WO  WO 01/86353 A1  11/2001

* cited by examiner

*Primary Examiner*—Rosemary Ashton
(74) *Attorney, Agent, or Firm*—Peter F. Corless; Darryl P. Frickey; Edwards Angell Palmer Dodge LLP

(57) ABSTRACT

Provided are new resins that comprise carbocyclic aryl units with hetero substitution units and photoresists that contain such resins. Particularly preferred photoresists of the invention comprise a deblocking resin that contains hydroxy naphthyl units and can be effectively imaged with sub-200 nm radiation such as 193 nm radiation.

17 Claims, 5 Drawing Sheets

AFM Images after etching under oxide etch conditions.

| Sample | VN/EEMA | MVN/EEMA | HVN/EEMA | HVN/EEA |
|--------|---------|----------|----------|---------|
| AFM Image |  |  |  |  |
| Rq | 5.46 nm | 3.82 nm | 0.37 nm | 0.24 nm |

AFM Images after etching under oxide etch conditions.

| Sample | MAMA/BLM* | HVN/MADA/NLA | t-butylacrylate/phenol |
|---|---|---|---|
| AFM Image |  |  |  |
| Rq | 7.4 | 3.38 nm | 2.18 nm |

BLM: beta-butyrolactone methacrylate

Lithographic performance of HVN/MADA/NLA-based resists

|  | 140 nm | 130 nm | 120 nm |
|---|---|---|---|
| T = 200 nm<br>E = 26.2 mJ/cm$^2$ | | | |
| T = 250 nm<br>E = 29.8 mJ/cm$^2$ | | | |
| T = 300 nm<br>E = 29.8 mJ/cm$^2$ | | | |

*SB and PEB both at 120 °C for 60 sec.

**ISI 193 Microstepper (0.60NA, 0.70σ)

Figure 3

SEM images obtained with HVN/MADA/NLA resists at T = 100 nm

| | 160 nm | 150 nm | 140 nm | 130 nm |
|---|---|---|---|---|
| 1:1<br>33 mJ/cm² | | | | |
| 1:1.5<br>24 mJ/cm² | | | | |
| Iso<br>24 mJ/cm² | | | | |

*ISI 193 Microstepper (0.60NA, 0.70σ)

Figure 4

SEM images obtained with HVN/MADA/NLA (10/50/40) resists at T = 250 nm

| | 150 nm | 140 nm | 130 nm | 120 nm |
|---|---|---|---|---|
| AR19 47.2 mJ/cm$^2$ |  |  |  |  |
| SiON 47.2 mJ/cm$^2$ |  |  |  |  |

*ISI 193 Microstepper (0.60NA, 0.70σ)

RESINS AND PHOTORESIST COMPOSITIONS COMPRISING SAME

BACKGROUND OF THE INVENTION

1. Field of the Invention

The present invention relates to new resins that comprise carbocyclic aryl units with hetero substitution (particularly hydroxy or thio) and photoresists that contain such resins. Preferred photoresists of the invention comprise a resin that contains hydroxy naphthyl groups.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of less than 200 nm, such as wavelengths of about 193 nm. Use of such short exposure wavelengths can enable formation of smaller features. Accordingly, a photoresist that yields well-resolved images upon 193 nm exposure could enable formation of extremely small (e.g. sub-0.25 µm) features that respond to constant industry demands for smaller dimension circuit patterns, e.g. to provide greater circuit density and enhanced device performance.

Silicon oxynitride (SiON) layers and other inorganics such as $Si_3N_4$ coatings have been employed in semiconductor device manufacture, for example as an etch stop layer and an inorganic antireflective layer. See, for instance, U.S. Pat. Nos. 6,124,217; 6,153,504; and 6,245,682.

SUMMARY OF THE INVENTION

We now provide new resins that contain a repeat unit that comprises a carbocyclic aryl unit substituted with one or more hetero-atom containing groups, particularly a carbocyclic aryl unit substituted with one or more oxygen or sulfur-containing groups. Such resins are particularly useful as a component of a photoresist composition.

We have surprisingly found that incorporation of such substituted carbocyclic aryl units into a polymer can provide significant improvements in lithographic performance of a photoresist containing the polymer. In particular, we have found that use of a resin that contains substituted carbocyclic aryl groups such as hydroxy naphthyl in a photoresist can enable development of a relief image of a significantly enhanced smooth profile (i.e. reduced line edge roughness). See, for instance, the comparative results set forth in the examples which follow.

We also have found that photoresists of the invention can adhere to inorganic surface layers, including SiON layers. See, for instance, the results set forth in Example 6 which follows. We have found that prior photoresists can adhere relatively poorly to such inorganic surface coatings, resulting in reduced resolution of a patterned image.

Preferred substituted carbocyclic aryl units for incorporation into a resin are naphthyl groups as well as other substituted carbocyclic aryl moieties such as hetero-substituted phenyl, anthracenyl, acenaphthyl, phenanthryl, and the like. Generally, hetero-substituted carbocyclic aryl groups having multiple fused rings (e.g. 2 or 3 fused rings, at least one of which is a carbocyclic aryl) are preferred such as hetero-substituted naphthyl, anthracenyl, acenaphthyl, phenanthryl, and the like.

A carbocyclic group may have a variety of hetero-substituents, with oxygen- and sulfur-containing substituents being generally preferred. For instance, preferred hetero-substituted carbocyclic aryl groups of resins of the invention include those aryl groups having one or more hydroxy (—OH), thio (—SH), alcohol (e.g. hydroxy$C_{1-6}$alkyl), thioalkyl (e.g. HS$C_{1-6}$alkyl), alkanoyl (e.g. C1-6alkanoyl such as formyl or acyl), alkylsulfide such as $C_{1-6}$alkylsulfide, carboxylate (including $C_{1-12}$ester), alkyl ether including $C_{1-8}$ether, and the like. Preferably, at least one hetero atom of the hetero-containing substituent has a hydrogen substituent (e.g. hydroxy is preferred over alkoxy). It is also preferred that the hetero group has the hetero atom directly linked to the carbocyclic ring (such as a hydroxy or thio ring substituents), or a hetero atom is a substituent of an activated carbon such as a ring substituent of —$CH_2OH$ or —$CH_2SH$, or other primary hydroxy or thio alkyl.

Preferred resins of the invention comprise repeat units in addition to substituted carbocyclic aryl units, particularly non-aromatic units such as provided by polymerization of an acrylate or an optionally substituted cyclic olefin (particularly carbon alicyclic or heteroalicyclic group) such as a polymerized optionally substituted norbornene. Preferably, for resin used in positive-acting resists, at least one of the resin repeat units contains a photoacid-labile moiety such as a photoacid-labile ester or acetal moiety. Particularly preferred resins are substantially free of any aromatic moieties other than the hydroxy naphthyl groups or other hetero-substituted carbocyclic aryl groups.

Additional preferred polymer units may be provided by polymerization of an anhydride such as maleic anhydride or itaconic anhydride; or lactones such as provided by polymerization of a suitable acrylate e.g. acryloxy-norbornane-butyrolactone and the like.

Photoresists of the invention preferably comprise one or more photoacid generator compounds (PAGs) as a photoactive component. Preferred PAGs for use in resists of the invention include onium salt compounds including iodonium and sulfonium compounds; and non-ionic PAGs such as imidosulfonate compounds, N-sulfonyloxyimide compounds; diazosulfonyl compounds and other sulfone PAGS including α,α-methylenedisulfones, disulfonehydrazines and disulfonylamine salts; nitrobenzyl compounds, halogenated particularly fluorinated non-ionic PAGS.

Photoresists of the invention also may contain a blend of resins, where at least one of the resins contains hydroxy naphthyl units or other hetero-substituted carbocyclic aryl groups. Preferably each member of the resin blend contains hydroxy naphthyl units or other hetero-substituted carbocyclic aryl groups.

Photoresists of the invention include both positive-acting and negative-acting compositions. Negative-acting compositions suitably comprise a separate crosslinker component, such as an amine-based material, e.g. a melamine or benzoguanamine resin.

The invention also includes methods for forming relief images, including methods for forming a highly resolved relief image such as a pattern of lines (dense or isolated) where each line has vertical or essentially vertical sidewalls and a line width of about 0.40 microns or less, or even about 0.25, 0.20, 0.15, or 0.10 microns or less. In such methods, preferably a coating layer of a resist of the invention is imaged with short-wavelength radiation, particularly sub-200 nm radiation, especially 193 nm radiation, and higher energy radiation having a wavelength of less than 100 nm, and otherwise high energy radiation such as EUV, electron beam, ion beam or x-ray. The invention further comprises articles of manufacture comprising substrates such as a microelectronic wafer having coated thereon the photoresists and relief images of the invention. The invention also provides methods for manufacturing such articles. Other aspects of the invention are discussed infra.

BRIEF DESCRIPTION OF THE DRAWINGS

FIGS. 3, 4 and 5 show Scanning Electron Micrograph (SEM) of photoresists of Examples 5 and 6 which follow.

DETAILED DESCRIPTION OF THE INVENTION

Figure 1:
FIGS. 1 and 2 show oxide etch results of the Examples 3 and 4 which follow.
Figure 1:
Figure 1:
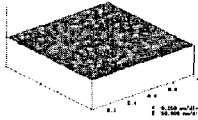
Figure 1:
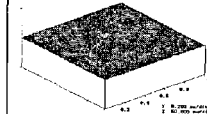

As discussed above, novel resins are now provided that comprise hetero-substituted (particularly hydroxy and thio) carbocyclic aryl moieties such as hydroxy naphthyl groups. Such resins can impart enhanced lithographic performance to a photoresist composition, including reduced line edge roughness of a developed relief image. Photoresists of the invention also can provide enhanced adhesion to an underlying surface, particularly underlying inorganic coating layers such as those containing SiON and/or $Si_3N_4$.

References herein to a hetero-substituted carbocyclic aryl group means that the carbocyclic group has one or more, typically one, two or three, ring substituents that contain a hetero atom, particularly oxygen or sulfur. That is, such references to "hetero-substituted" designate moieties that contain one or more hetero atoms, particularly one or two oxygen and/or sulfur atoms, that are ring substituents of the carbocyclic aryl group.

References herein to hydroxy naphthyl groups or other similar term means a naphthyl group that has at least one hydroxy ring substituent. The naphthyl group may suitably have more than one hydroxy group, such as two or three hydroxy ring substituents, although it is generally preferred that the naphthyl group contain a single hydroxy substituent.

A resin may suitably contain a relatively wide range of amounts of hydroxy naphthyl units or other hetero-substituted carbocyclic aryl groups. Enhanced lithographic results can be realized with use of a resin that contains quite minor amounts of the hydroxy naphthyl units. For example, a resin may suitably contain less than about 50 or 40 mole percent of hetero-substituted carbocyclic aryl units based on total units of a resin, or even less than about 30, 20, 15 or 10 mole percent of hetero-substituted carbocyclic aryl units based on total units of the polymer. Indeed, a resin may suitably contain about 0.5, 1, 2, 3, 4, 5, 6, 7 or 8 mole percent of hydroxy naphthyl units based on total units of the resin. Typically, a resin will contain at least about 1, 2, 3, 4 or 5 mole percent of hetero-substituted carbocyclic aryl units such as hydroxy naphthyl units based on total resin units. Generally preferred are resins that contain at least or up to about 10, 20, 30, 40, or 45 hetero-substituted carbocyclic aryl units such as hydroxy naphthyl units based on total resin units.

As discussed above, a resin of the invention may comprise a variety of other units in addition to hetero-substituted carbocyclic aryl units. Preferred additional units include polymerized acrylate and cyclic olefin groups.

Preferred polymerized cyclic olefin groups include those that comprise a carbon alicyclic or heteroalicyclic group either pendant or often preferably fused to the resin backbone.

Such a preferred carbon alicyclic group (i.e. the group has all carbon ring members) that is fused to the polymer backbone has at least two carbon alicyclic ring members (typically two adjacent carbon ring atoms) that comprise the polymer backbone. Preferred fused carbon alicyclic groups are provided by polymerization of cyclic olefin (endocyclic double bond) compounds such as optionally substituted norbornene groups. Other suitable carbon alicyclic groups may be provided by polymerization of a vinyl adamantyl or isobornyl group or the like.

Such a preferred heteroalicyclic group (i.e. nonaromatic and has at least one ring N, O or S atom, preferably one or two O or S atoms) that is fused to the resin backbone has at least two heteroalicyclic ring atoms (typically two adjacent ring atoms) as part of the resin backbone.

Such fused carbon alicyclic or heteroalicyclic groups can be suitably incorporated into a resin by polymerizing a cyclic monomer that has an endocyclic double bond. Suitable and preferred heteroalicyclic and carbon alicyclic resin groups are also disclosed in U.S. Pat. No. 6,306,554 to Barclay et al.

For resins used in positive-acting photoresists, preferably the resin or other resist component contains photoacid-labile groups such as photoacid-labile ester or acetal groups which can provide sufficient solubility differentials between exposed and unexposed regions of a resist coating layer. For example, a resin may suitably contain polymerized tert-butyl acrylate, tert-butyl methacrylate, methyladmantyl acrylate, and/or methyladamantyl methacrylate units, and the like. Unless otherwise specified, references herein to acrylate groups or compounds are inclusive of substituted acrylate compounds such as methacrylate compounds.

Preferred polymerized acrylate groups may include an alicyclic group. As referred to herein, the term "alicyclic leaving group" of a resin means the following: an alicyclic group that is covalently bound to a polymer, and when such a polymer is formulated in a photoresist containing the polymer and a photoactive component (particularly one or more photoacid generators), the alicyclic group can be or is cleaved from the polymer (i.e. covalent bond to the polymer cleaved) upon exposure to acid generated upon exposure of a coating layer of the photoresist to activating radiation (e.g. 193 nm), typically with post-exposure thermal treatment (e.g. 90° C., 100° C. or 110° C. for 0.5, 1 or more minutes).

An alicyclic acrylate compound contains a vinyl ester, where the ester moiety is an alicyclic group such as methyl adamantyl and the like. The vinyl group suitably may be substituted, particularly at the alpha-vinyl carbon such as by $C_{1-8}$alkyl and thus includes methacrylates.

For use in positive-acting photoresists, resins that contain photoacid-labile ester groups are often preferred such as a tert-butyl ester, or an ester containing a tertiary alicyclic group. Such photoacid-labile esters may be directly pendant from a carbon alicyclic, heteroalicyclic or other polymer unit (e.g. where the photoacid-labile group is of the formula —C(=O)OR, where R is tert-butyl or other non-cyclic alkyl group, or a tertiary alicyclic group and is directly linked to the polymer unit), or the ester moieties may be spaced from the from a heteroalicyclic or carbon alicyclic polymer unit, e.g. by an optionally alkylene linkage (e.g. —(CH$_2$)$_{1-8}$C (=O)OR, where R is tert-butyl or other non-cyclic alkyl group, or a tertiary alicyclic group). Such photoacid-labile groups also suitably may be contain fluorine substitution at available positions.

Preferred tertiary alicyclic hydrocarbon ester photoacid-labile moieties are polycyclic groups such adamantyl, ethylfencyl or a tricyclo decanyl moiety. References herein to a "tertiary alicyclic ester group" or other similar term indicate that a tertiary alicyclic ring carbon is covalently linked to the ester oxygen, i.e.—C(=O)O-TR' where T is a tertiary ring carbon of alicyclic group R'. In at least many cases, preferably a tertiary ring carbon of the alicyclic moiety will be covalently linked to the ester oxygen, such as exemplified by the below-depicted specifically preferred polymers. However, the tertiary carbon linked to the ester oxygen also can be exocyclic to the alicyclic ring, typically where the alicyclic ring is one of the substituents of the exocyclic tertiary carbon. Typically, the tertiary carbon linked to the ester oxygen will be substituted by the alicyclic ring itself, and/or one, two or three alkyl groups having 1 to about 12 carbons, more typically 1 to about 8 carbons, even more typically 1, 2, 3 or 4 carbons. The alicyclic group also preferably will not contain aromatic substitution. The alicyclic groups may be suitably monocyclic, or polycyclic, particularly bicyclic or tricyclic groups.

Preferred alicyclic moieties (e.g. group TR' of —C(=O) O-TR') of photoacid labile ester groups of polymers of the invention have rather large volume. It has been found that such bulky alicyclic groups can provide enhanced resolution when used in copolymers of the invention.

More particularly, preferred alicyclic groups of photoacid labile ester groups will have a molecular volume of at least about 125 or about 130 Å$^3$, more preferably a molecular volume of at least about 135, 140, 150, 155, 160, 165, 170, 175, 180, 185, 190, 195, or 200 Å$^3$. Alicyclic groups larger than about 220 or 250 Å$^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277-287.

Particularly preferred tertiary alicyclic groups of photoacid-labile units include the following, where the wavy line depicts a bond to the carboxyl oxygen of the ester group, and R is suitably optionally substituted alkyl, particularly $C_{1-8}$ alkyl such as methyl, ethyl, etc.

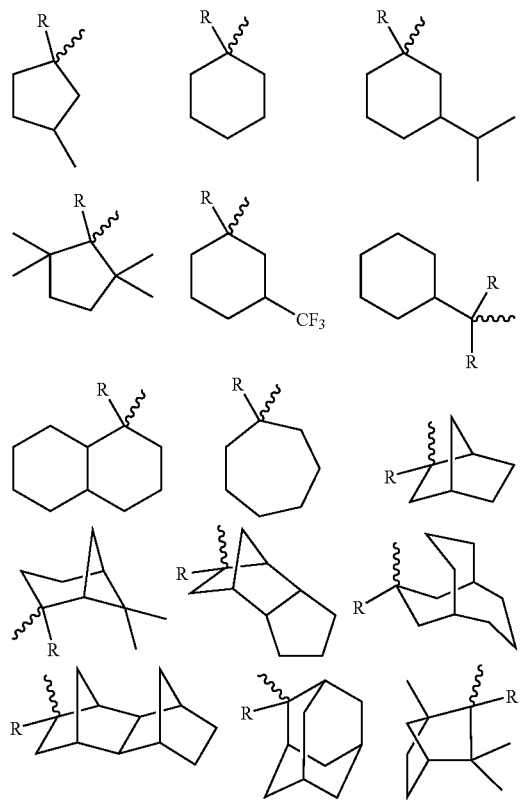

Polymers used in resists of the invention also may contain distinct photoacid-labile groups, i.e. the polymer may contain two or more ester groups that have distinct ester moiety substitutions e.g. one ester may have an alicyclic moiety and another ester may have an acyclic moiety such as t-butyl, or the polymer may contain both ester and other functional groups that are photoacid-labile such as acetals, ketals and/or ethers.

In any event, for use in positive-acting resists, polymers of the invention preferably comprise contain one or more repeat units that comprise a photoacid-labile group. Generally preferred is where the photoacid labile group(s) are a component of polymer units other than the hetero-substituted carbocyclic aryl groups.

Preferred polymers also may contain lactone units, such as lactones that are moieties of a polymerized acrylate, or other lactone polymerized from other unstaruated molecule. Polymer units containing alpha-butyrolactone groups are suitable. Resin repeat units that comprise a cyano moiety also are suitable, such as may be provided by polymerization of acrylonitrle or methacrylonitrile.

Preferred polymers of the invention contain 2, 3, 4 or 5 distinct repeat units, i.e. preferred are copolymers, terpolymers, tetrapolymers and pentapolymers that contain one or more alicyclic groups as disclosed herein.

Polymers of the invention are preferably employed in photoresists imaged at 193 nm and suitably will be substantially free of any phenyl or other aromatic groups other than the hetero-substituted carbocyclic aryl units. For example, preferred polymers contain less than about 5 mole percent aromatic groups other than the hetero-substituted carbocyclic aryl units, more preferably less than about 1 or 2 mole percent aromatic groups hetero-substituted carbocyclic aryl units.

As discussed, various moieties of resin units may be optionally substituted. A "substituted" substituent may be substituted at one or more available positions, typically 1, 2, or 3 positions by one or more suitable groups such as e.g. halogen (particularly F, Cl or Br); cyano; $C_{1-8}$ alkyl; $C_{1-8}$ alkoxy; $C_{1-8}$ alkylthio; $C_{1-8}$ alkylsulfonyl; $C_{2-8}$ alkenyl; $C_{2-8}$ alkynyl; hydroxyl; nitro; alkanoyl such as a $C_{1-6}$ alkanoyl e.g. acyl and the like; etc.

Preferred substituted carbocyclic aryl units for incorporation into a resin are naphthyl groups substituted with one or more hydroxy (—OH), thio (—SH), alcohol (e.g. hydroxy$C_{1-6}$alkyl), thioalkyl (e.g. HS$C_{1-6}$alkyl), alkanoyl (e.g. C1-6alkanoyl such as formyl or acyl), alkylsulfide such as $C_{1-6}$alkylsulfide, carboxylate (including $C_{1-12}$ester), alkyl ether including $C_{1-8}$ether, and the like. Preferably, at least one hetero atom of the hetero-containing substituent has a hydrogen substituent (e.g. hydroxy is preferred over alkoxy). It is also preferred that the hetero group has the hetero atom directly linked to the carbocyclic ring (such as a hydroxy or thio ring substituents), or a hetero atom is a substituent of an activated carbon such as a ring substituent of —CH$_2$OH or —CH$_2$SH, or other primary hydroxy or thio alkyl.

Polymers of the invention can be prepared by a variety of methods. One suitable method is an addition reaction which may include free radical polymerization, e.g., by reaction of selected monomers to provide the various units as discussed above in the presence of a radical initiator under an inert atmosphere (e.g., N$_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran or more suitably a halogenated solvent such as a fluorinated solvent or a chlorinated solvent and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed. See Example 2 which follows for exemplary preferred reaction conditions and procedures.

The synthesis of a preferred hetero-substituted carbocyclic aryl reagent that may be polymerized in a resin of the invention is set forth in Example 1 below. Generally, heterosubstituted carbocyclic aryl units that have such vinyl substitution are preferred reagents to form a resin of the invention.

Other monomers that can be reacted to provide a polymer of the invention can be identified by those skilled in the art. For example, to provide photoacid-labile units, suitable monomers include e.g. methacrylate or acrylate that contains the appropriate group substitution (e.g. tertiary alicyclic, t-butyl, etc.) on the carboxy oxygen of the ester group. Suitable acrylate monomers with tertiary alicyclic groups for synthesis of polymers useful in the resists of the invention also are disclosed in U.S. Pat. No. 6,306,554 to Barclay et al. Maleic anhydride is a preferred reagent to provide fused anhydride polymer units. Vinyl lactones are also preferred reagents, such as alpha-butyrolactone.

Some suitable vinyl (endocyclic double bond) heterocyclic monomers that can be polymerized to provide polymers of the invention include the following:

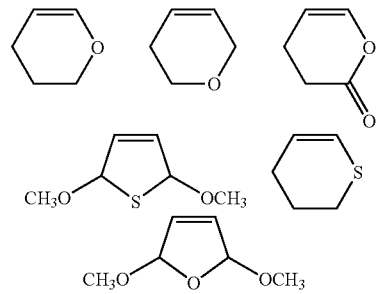

Preferably a polymer of the invention will have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

Polymers of the invention used in chemically-amplified positive-acting photoresist formulations should contain a sufficient amount of photogenerated acid labile groups to enable formation of resist relief images as desired. For instance, suitable amount of such acid labile groups will be at least 1 mole percent of total units of the polymer, more preferably about 2 to 7 mole percent, still more typically about 3 to 30, 40, 50 or 60 mole percent of total polymer units.

Photoresists of the invention in general comprise a photoactive component and a resin binder component that comprises a polymer as described above.

The resin component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

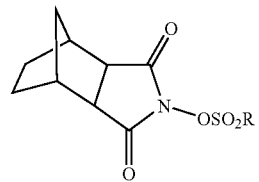

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

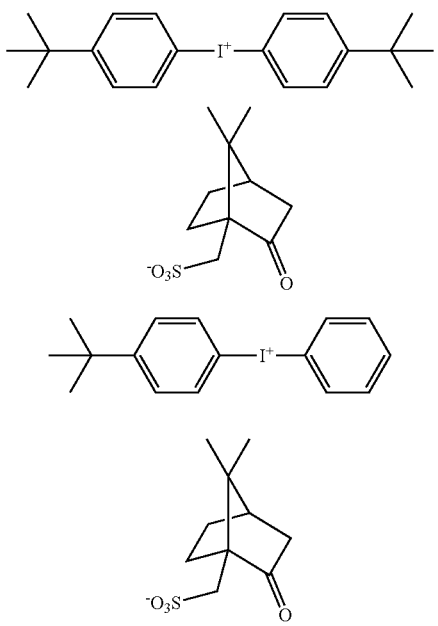

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3^-$ where R is, adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Also preferred is a triphenyl sulfonium PAG, complexed with anions such as the sulfonate anions mentioned above, particularly a perfluoroalkyl sulfonate such as perfluorobutane sulfonate.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a lactate salt of tetrabutylammonium hydroxide as well as various other amines such as triisopropanol, diazabicyclo undecene or diazabicyclononene. The added base is suitably used in relatively small amounts, e.g. about 0.03 to 5 percent by weight relative to the total solids.

As discussed above, negative-acting photoresists suitably will contain a crosslinker component in addition to a resin having hetero-substituted carbocyclic aryl units and a photoactive component. Suitable crosslinker component may comprise an amine-based material, such as a melamine or benzoguanamine resin.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, 2-heptanone, cyclohexanone, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. As discussed above, 193 nm is a particularly preferred exposure wavelength. Exposure with 248 nm radiation also is preferred. However, the resist compositions of the invention also may be suitably imaged at higher wavelengths. For example, a resin of the invention can be formulated with an appropriate PAG and sensitizer if needed and imaged at higher wavelengths e.g. 248 nm or 365 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLE 1

Synthesis of 6-Hydroxy-2-Vinylnaphthalene (HVN)

The synthesis of 6-hydroxy-2-vinylnaphthalene (HVN) was carried out by three step reactions starting from 6-hydroxy-2-naphthaldehyde. In the first step, 6-hydroxy-2-naphthaldeyde (HNAL) was protected with ethyl vinyl ether to give 6-(1-ethoxy ethoxy)-2-naphthaldehyde (EENAL). This was followed by the Wittig reaction of EENAL to yield 6-(1-ethoxy ethoxy)-2-vinylnaphthalene. Finally, this was deprotected using pyridinium p-toluenesulfonate to yield 6-hydroxy-2-vinylnaphthalene (HVN).

6-(1-Ethoxy ethoxy)-2-naphthaldehyde. In a 500 mL three neck flask, equipped with a magnetic stirrer, an addition funnel, and a reflux condenser, were charged 25 g of HNAL (0.1462 mol) and 300 mL of ethyl acetate. 6-Hydroxy-2-naphthaldeyde was not completely soluble even after 3 h stirring at room temperature. To this was added 3.30 g of PPTS (0.0131 mol) and the solution mixture was heated to 70° C. At this temperature, 21 g of ethyl vinyl ether (0.2912 mol) was added dropwise and the reaction mixture became homogeneous upon addition of a few drops of ethyl vinyl ether. After completion of ethyl vinyl ether addition, the reaction temperature was lowered to room temperature and the reaction mixture was stirred overnight. The crude product was purified by column chromatography (silica gel, $CH_2Cl_2$) to yield 26 g of pure 6-(1-ethoxy ethoxy)-2-naphthaldehyde (yield: 73%).

6-(1-Ethoxy ethoxy)-2-vinylnaphthalene. In a 1 L three neck flask, equipped with an overhead mechanical stirrer, was added 45 g of methyltriphenylphosphonium bromide (0.126 mol) under nitrogen atmosphere. To this were added anhydrous 300 mL of THF and 16.02 g of potassium tert-butoxide (0.1428 mol). After 1 h of stirring, 20 g of 6-(1-ethoxy ethoxy)-2-naphthaldehyde (0.0819 mol), dissolved in 50 mL of THF, was added dropwise using a cannular and the reaction mixture was stirred overnight. After overnight stirring, deionized water (200 mL) was added with a syringe and the phases were separated. The aqueous phase was extracted with ether (2×100 mL) and the combined extracts were dried over $MgSO_4$. After filtration and concentration, the crude product was purified by column chromatography (silica gel, hexane/$CH_2Cl_2$ 40/60~10/90) to yield 19.12 g of pure 6-(1-ethoxy ethoxy)-2-vinylnaphthalene (96%).

6-Hydroxy-2-vinylnaphthalene. 18 g of 6-(1-Ethoxy ethoxy)-2-vinylnaphthalene (0.0743 mol) was dissolved in 80 mL of ethanol. To this was added 1.6 g of pyridinium p-toluenesulfonate (0.0064 mol). The reaction mixture was stirred at 50° C. After 3 h, TLC analysis (silica, $CH_2Cl_2$) indicated that the reaction was over. The reaction mixture was cooled down to room temperature and the solvent was removed under reduced pressure. The crude product was purified by column chromatography (silica gel, $CH_2Cl_2$) to yield 11.15 g of pure 6-hydroxy-2-vinylnaphthalene (62%).

EXAMPLE 2

Synthesis of HVN/MADA/NLA Terpolymer (Polymer Consisting of Polymerized Units of: 6-hydroxy-2-vinylnaphthalene (HVN); 2-methyl-2-adamantyl Acrylate (MADA); and acryloxy-norbornane-butyrolactone (NLA))

1.66 g of HVN, 4.29 g of 2-methyl-2-adamantyl acrylate (MADA), 4.05 g of acryloxy-norbornane-butyrolactone (NLA), and 0.2242 g of V601 (dimethyl-2,2-azodiisobutyrate) were dissolved in 30 mL of THF. This mixture was degassed by bubbling with nitrogen for 20 min and then placed in an oil bath kept at 75° C. to start polymerization. After polymerization for 12 h, the polymerization mixture was precipitated into hexane/isopropanol 80/20 v/v mixture. Second precipitation was carried out in hexane/isopropanol 50/50 v/v mixture. After filtration, a slight yellowish powder was obtained and this was dried in a vacuum oven at 50° C. overnight to yield 9 g of HVN/MADA/NLA terpolymer (90% yield).

Other copolymers were prepared using a similar procedure and results are summarized below. MVN is 2-vinyl-6-methoxynaphthalene.

| Copolymer | Composition | Yield | Mw | Mw/Mn | OD at 193 nm |
| --- | --- | --- | --- | --- | --- |
| VN/EEMA | 60/40 | 62% | 9,160 | 1.39 | 3.8 |
| MVN/EEMA | 60/40 | 76% | 12,114 | 1.62 | — |
| HVN/EEMA | 60/40 | 73% | 15,085 | 1.61 | 3.2 |
| HVN/EEA | 60/40 | 90% | 19,900 | 2.03 | — |
| HVN/NLA/MADA | 20/40/40 | 90% | 16,200 | 3.64 | 1.1 |

EXAMPLE 3

A copolymer of 2-vinylnaphthalene (VN) and 1-ethoxy ethyl methacrylate (EEMA) with 60 mol % of VN was prepared. This copolymer was spin-coated on a Si wafer, etched under oxide etch conditions ($C_4F_8$/Ar/CO/$O_2$; 1500 W; 45 mT) for 60 sec, and then surface roughness was measured using atomic force microscopy (AFM). This copolymer exhibited the rms roughness (Rq) of 5.46 nm.

A further group of polymers were then prepared of the following components and surface roughness examined after etching under oxide etch conditions.

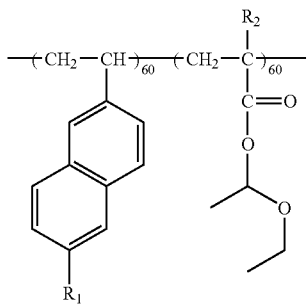

VN/EEMA: $R_1$ = H and $R_2$ = $CH_3$
MVN/EEMA: $R_1$ = $OCH_3$ and $R_2$ = $CH_3$
HVN/EEMA: $R_1$ = OH and $R_2$ = $CH_3$
HVN/EEA: $R_1$ = and $R_2$ = H These copolymers were spin-coated on Si wafers with film thickness ~500 nm and then etched under oxide etch conditions for 60 sec. Under these conditions, 50~100 nm of thickness loss was observed. The partially etched wafers were then examined using AFM to see the effect of substituents on post-etch roughness. Results are summarized in FIG. 1.

EXAMPLE 4

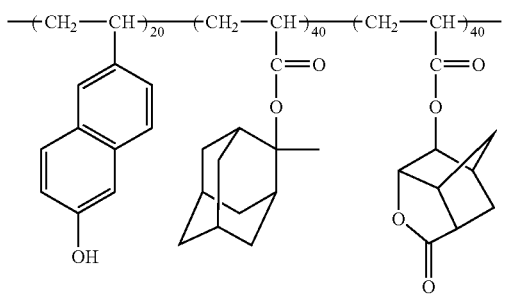

HVN/MADA/NLA

HVN/MADA/NLA (20/40/40) terpolymer was prepared and its lithographic performances were evaluated. Tg of HVN/MADA/NLA (20/40/40) was measured to be 147° C., which is significantly higher than that of 50/50 MADA/NLA (Tg=115° C.).

Figure 2:
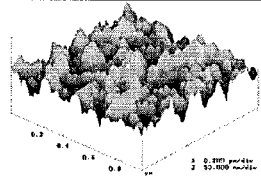
Figure 2:
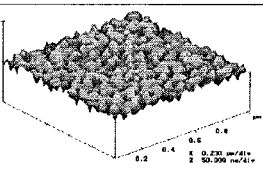
Figure 2:
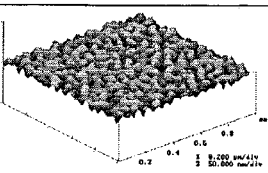

Although the incorporation of 20 mol % of HVN to MADA/NLA copolymer resulted in a slight increase in absorbance at 193 nm ($1.10\ \mu m^{-1}$), the resulting terpolymer exhibited superior post-etch smoothness as well as lithographic performances to the original MADA/NLA copolymer. Post-etch roughness of HVN/MADA/NLA was measured using AFM and results are listed in FIG. 2 along with acrylic 193 nm resist (MAMA/BLM) and a resist containing a phenol/t-butyl acrylate copolymer.

EXAMPLE 5

Lithographic performances of HVN/MADA/NLA (20/40/40) terpolymer were tested using 2.32% TBPTMSPFBuS as a PAG and 0.18% N-allyl caprolactam as a base. FIG. 3 shows cross-sectional SEM images of 1:1.5 line/space patterns obtained with different film thickness without process or formulation optimization. It is clearly demonstrated that, even with a moderately absorbing resist (OD~1.1 $\mu m^{-1}$), straight sidewall profiles can be obtained when the resist thickness is reduced.

HVN/MADA/NLA (20/40/40) terpolymer resist was also tested at T=100 nm using the same formulation and process conditions. As shown in FIG. 4, 1:1 line/space patterns were readily resolved down to 130 nm without optimization.

EXAMPLE 6

Figure 5:
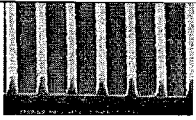
Figure 5:
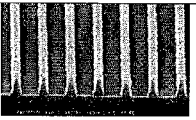
Figure 5:
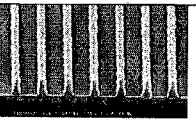
Figure 5:
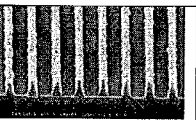
Figure 5:
Figure 5:
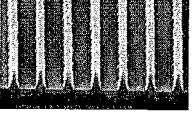
Figure 5:
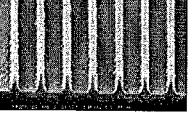
Figure 5:
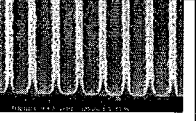

HVN/MAMA/NLA (10/50/40) copolymer was also synthesized and formulated with 3% sulfonium PAG and 0.18% N-allyl caprolactam. Lithographic performances were tested on both organic antireflective underlayer and inorganic (SiON) underlayer substrates and results are compared in FIG. 5. It should be noted that HVN/MAMA/NLA-based resist exhibits excellent adhesion on the inorganic substrate, SiON.

EXAMPLE 7

Preparation of a Photoresist of the Invention

A resist of the invention is prepared by admixing the following components where amounts are expressed as weight percent of solids (all components except solvent) and the resist is formulated as an 85 weight percent fluid formulation:

| Component | Amount |
| --- | --- |
| Resin | balance |
| PAG | 5 |
| Basic Additive | 0.3 |
| Surfactant | 0.1 |
| Solvent | to 85 percent formulation |

In the resist, the resin is the polymer of Example 5 above. The PAG is triphenylsulfonium perfluorobutane sulfonate. The basic additive is tetrabutylammonium lactate. The surfactant is R08. The solvent is ethyl lactate.

The formulated resist composition is spin coated onto HMDS vapor primed 4 inch silicon wafers and softbaked via a vacuum hotplate at 120° C. for 90 seconds. The resist coating layer is exposed through a photomask at 193 nm, and then the exposed coating layers are post-exposure baked at 100° C. The imaged resist layer is then developed by treatment with an aqueous tetramethylammonium hydroxide solution.

The foregoing description of the invention is merely illustrative thereof, and it is understood that variations and modifications can be effected without departing from the spirit or scope of the invention as set forth in the following claims.

What is claimed is:

1. A method for providing a photoresist relief image, comprising:
    a) applying a coating layer of a positive-acting photoresist composition on a substrate, the photoresist composition comprising a photoactive component and a terpolymer resin that comprises hydroxy naphthyl groups and lactone groups, the terpolymer resin having a weight average molecular weight of from greater than 2,000 to about 100,000; and b) exposing the photoresist composition layer to activating radiation having a wavelength of 193 nm and developing the exposed photoresist composition coating layer.

2. The method of claim 1 wherein the resin comprises photoacid-labile groups.

3. The method of claim 2 wherein the photoacid-labile groups are eaters or acetal groups.

4. The method of claim 1 wherein the resin comprises polymerized acrylate units.

5. The method of claim 4 wherein the polymerized acrylate units comprise a photoacid-labile ester group.

6. The method of claim 1 wherein the resin comprises units that contain a hydroxy naphthyl group in an amount up to about 20 mole percent based on total units of the polymer.

7. The method of claim 1 wherein the terpolymer comprises carbon alicyclic groups.

8. The method of claim 1 wherein the terpolymer comprises adamantyl groups.

9. A positive-acting photoresist composition comprising a photoactive component and a terpolymer that comprises hydroxy naphttiyl groups and lactone groups, the terpolymer resin substantially free of aromatic groups other than the hydroxy naphthyl groups, and the resin having a weight average molecular weight of from greater than 2,000 to about 100,000.

10. The photoresist composition of claim 9 wherein the resin comprises photoacid-labile groups.

11. The photoresist composition of claim 9 wherein the resin comprises unite that contain a hydroxy naphthyl group in an amount up to about 20 mole percent based on total units of the polymer.

12. A positive-acting photoresist composition consisting essentially of:

one or more photoacid generator compounds; and a terpolymer resin that comprises (i) photoacid-labile groups, (ii) and lactone groups and (iii) units that comprise a hydroxy naphthyl group.

13. The photoresist composition of claim 12 wherein the photoresist consists of one or more photoacid-generator compounds, the resin and a base additive.

14. The photoresist composition of claim 12 wherein the terpolymer comprises carbon alicyclic groups.

15. The photoresist composition of claim 12 wherein the terpolymer comprises adamantyl groups.

16. A method for providing a photoresist relief image, comprising:

a) applying a coating layer of a positive-acting photoresist composition on a substrate, the photoresist composition comprising a photoactive component and an acrylate terpolymer resin that comprises 1) hydroxy naphthyl groups, 2) lactone groups and 3) photoucid-labile groups that are distinct from the hydroxy riaphihyl groups; and b) exposing the photoresist composition layer to activating radiation having a wavelength of 193 nm and developing the exposed photoresist composition coating layer.

17. A positive-acting photoresist composition comprising a photoactive component and an acrylate terpolymer resin that comprises 1) hydroxyl naphthyl groups, 2) lactone groups and 3) photoacid-labile groups that are distinct from the hydroxy naphthyl groups, the resin being substantially free of aromatic groups other than the hydroxy naphthyl groups.

* * * * *